United States Patent [19]

Val

[11] 4,408,256

[45] Oct. 4, 1983

[54] MICROBOX FOR ELECTRONIC CIRCUIT AND HYBRID CIRCUIT HAVING SUCH A MICROBOX

[75] Inventor: Christian Val, Paris, France

[73] Assignee: Thomson-CSF, Paris, France

[21] Appl. No.: 346,907

[22] Filed: Feb. 8, 1982

Related U.S. Application Data

[63] Continuation of Ser. No. 148,043, May 8, 1980, abandoned.

[30] Foreign Application Priority Data

May 10, 1979 [FR] France .............................. 79 11852

[51] Int. Cl.³ .............................................. H05K 7/02
[52] U.S. Cl. ..................................... 361/403; 361/306; 361/409; 361/414
[58] Field of Search ........................... 174/52 FP, 68.5; 361/400, 401, 403, 402, 414, 275, 301, 306, 311, 312, 329, 303, 304, 283, 409, 410

[56] References Cited

U.S. PATENT DOCUMENTS

| 2,673,949 | 3/1954 | Khouri | 361/329 |
| 2,694,185 | 11/1954 | Kodama | 361/329 |
| 3,270,261 | 8/1966 | Mohler | 361/306 |
| 3,491,275 | 1/1970 | Puppolo | 361/306 |
| 3,880,493 | 4/1975 | Lockhart, Jr. | 361/271 |
| 4,247,881 | 1/1981 | Coleman | 361/330 |

FOREIGN PATENT DOCUMENTS 562043 10/1932 Fed. Rep. of Germany ...... 361/328

Primary Examiner—G. P. Tolin
Attorney, Agent, or Firm—Oblon, Fisher, Spivak, McClelland & Maier

[57] ABSTRACT

The invention relates to microboxes for encapsulating electronic circuits.

Electronic circuits frequently comprise decoupling capacitors or the like, which occupy a large amount of space compared with the integrated parts of the box. The invention provides for the use of the bottom or substrate of the encapsulating box as capacitors after metallizing the two faces. The dielectric material is matched to the desired capacitance values. The microbox substrate is formed by a multilayer capacitor for high values.

5 Claims, 6 Drawing Figures

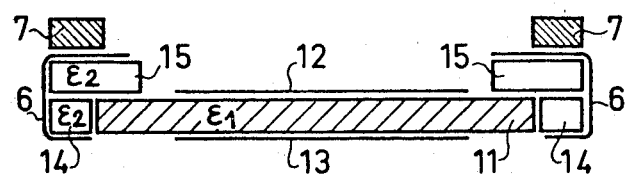
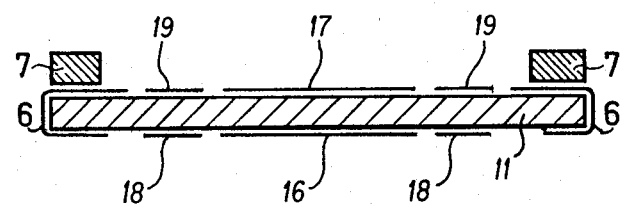
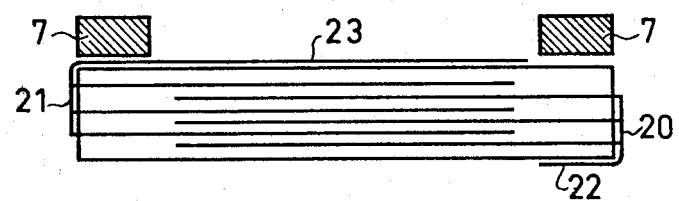

MICROBOX FOR ELECTRONIC CIRCUIT AND HYBRID CIRCUIT HAVING SUCH A MICROBOX

This is a continuation of application Ser. No. 148,043, filed May 8, 1980, now abandoned.

BACKGROUND OF THE INVENTION

1. Field of the Invention

The invention relates to boxes encapsulating hybrid circuits and more specifically to the integration of one or more decoupling capacitors into the box.

2. Description of the Prior Art

Hybrid circuits which bring together on the same board or substrate components, some of which are called "discrete," such as transistors, resistors, capacitors and the like form integrated circuits. The latter are in the form either of microboxes, generally coated with a plastic material, or bare chips in which case they are encapsulated in ceramic microboxes without connections, referred to as "chip carriers."

Moreover, it is frequently necessary for a circuit to have at least one or two decoupling capacitors which, through not being integrable have large dimensions compared with those of the integrated circuit. Thus, the assembly consisting for example of an input capacitor, a circuit and an output capacitor occupies a by no means inconsiderable surface area of the hybrid surface substrate which runs counter to the increased density imposed by the sophistication of existing equipment.

BRIEF SUMMARY OF THE INVENTION

The invention consists of using the base of the ceramic microbox as a dielectric for the decoupling capacitor or capacitors by, if necessary, using products other than alumina for producing capacitors having suitable values and acceptable thicknesses.

More specifically, the invention relates to a microbox for an electronic circuit having a partly metallized box bottom to which is fixed the circuit chip, wherein on the one hand the box bottom is metallized on the two main bases in order to form the foils of at least one capacitor, and on the other the rigid material of the box bottom is chosen from among those having a high dielectric constant.

BRIEF DESCRIPTION OF THE DRAWINGS

The invention is described in greater detail hereinafter relative to non-limitative embodiments and the attached drawings, wherein show:

FIG. 4 an improvement to the microbox according to the invention.
FIG. 5 a second improvement to the invention.
FIG. 6 a third improvement to the invention.

DETAILED DESCRIPTION OF THE PREFERRED EMBODIMENTS

Figure 1:
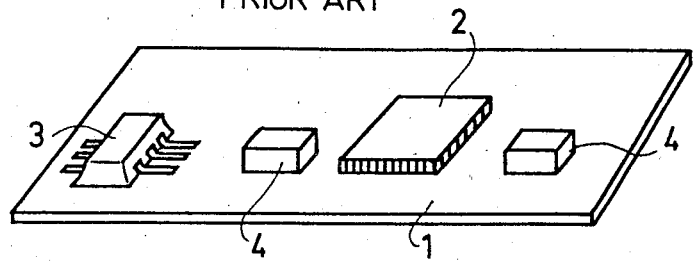
FIG. 1 a paior art hybrid circuit.

FIG. 1 shows in highly simplified form a hybrid circuit. The substrate 1 carries two encapsulated circuits 2, 3 and two input/output decoupling capacitors 4, which connect between active circuits, together with numerous other components which are not shown. Circuit 2 is encapsulated in a ceramic box of the chip carrier type and circuit 3 is encapsulated in a plastic box of the type known under the symbol S08 in International Standards.

The function of FIG. 1 is to show that, even without a precise scale, the connecting capacitor or capacitors which are welded to the substrate on the side of an active circuit, such as an integrated circuit, occupy a by no means negligible surface area compared with the microbox and which in all cases exceeds that of the bare chip of the active circuit. This is contrary to the need for compactness.

Figure 2:
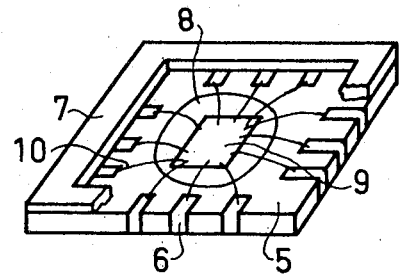
FIG. 2 a prior art ceramic microbox without its cover.

FIG. 2 shows a prior art microbox from which the cover has been removed and from which also part of the sides has been removed in order to more clearly show the interior thereof. This type of microbox is constituted by a bottom or substrate 5 made from alumina, ceramic material or any other material which is at the same time rigid, electrically insulator and preferably a good thermal conductor. Metal coating 6 or external connectors connect two connection regions on either side of the substrate. The welds of the connecting wires to the integrated circuit chip take place on the regions on one face, whilst the regions on the other face are welded to the hybrid circuit. A frame 7 gives the microbox a thickness such that the not shown cover does not touch the connecting wires.

The bottom of the microbox has a metallized region 8, whose function is to permit the fixing by welding of the integrated circuit chip 9. The connecting regions to the integrated circuit are joined to the connecting regions to the metal coatings 6 by means of gold or aluminium wires 10. It should be noted that in almost all cases where the active circuit is on silicon or gallium arsenide the microbox has a metal coating 8, which is often of gold, to form a gold-silicon weld eutectic.

Figure 3:
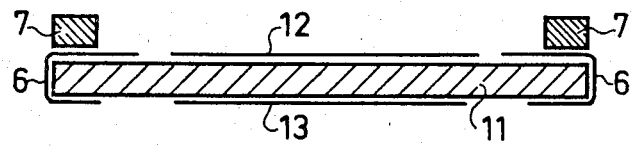
FIG. 3 a sectional view of a microbox according to the invention.

FIG. 3 is a highly simplified sectional view of a microbox according to the invention.

Fundamentally, the invention uses a substrate 11 of the microbox and the metallized region 12 on the inner face of the substrate to form a capacitor, supplemented by a second metallized region 13 on the other main face of the substrate. Dielectric 11 and foil 12 of this capacitor correspond respectively to substrate 5 and the metallized region 8 of FIG. 2, but the reference numerals have been changed because the nature and shape of the members are matched to the capacitor construction.

Under these conditions, the base of the microbox serving as the dielectric 11 has characteristics and thickness matched in such a way that the desired capacitance value is obtained. Account is taken of the area of the metal coating 12, which must be at least sufficiently large that the integrated circuit chip 9 can be welded thereto, but at the most sufficiently small to pass within the microbox without short circuiting the connectors 6. Thus, the precise capacitance values obtained by a compromise between the characteristics of the possible materials, i.e. alumina, barium titanate, etc, the thickness of the dielectric formed by the selected material and the calculated area of the metallized foil 12, which may only vary within small proportions. The area of the metallized foil 13 can be larger than that of the inner foil 12.

The technology used for forming foils 12 and 13 does not necessitate complex metallic chains of the molybdenum/manganese plus nickel plus gold type, or molybdenum/tungsten plus nickel plus gold type, or tungsten plus nickel plus gold type. The simpler, industrially more advantageous and less costly technology of metallization by a palladium-based paste deposited for example by silk screen printing is much more suitable. It also facilitates the weldability of the integrated circuit to the microbox and of the microbox to the hybrid circuit, because metallization with palladium is compatible with the lead/tin weld, whilst metallization processes using gold lead to brittle compounds.

The microbox of FIG. 3, formed from a capacitor which fulfils the function of the box base, is supplemented by connectors 6, a frame 7 and a not shown cover.

FIG. 4 shows an improvement of the basic invention as shown in FIG. 3. Substrate 11 used as the dielectric of a capacitor is made from a material having a high dielectric constant. In this case and if the bottom of the box is made in one piece, as is the case in FIG. 3, stray capacitances can appear between two adjacent connecting strips 6, separated by a material with a high dielectric constant.

According to the invention, the bottom of the box is made from a composite material. The central part constituting the dielectric 11 of the capacitor has a high dielectric constant $\Sigma_1$. The outer part, which supports connectors 6 has a low dielectric constant $\Sigma_2$. This outer part is constituted by at least one frame 14, which has a thickness equal to that of the dielectric 11 and dimensions sufficient to enable the metal coatings of connectors 6 to be deposited there in the plane of foil 12. However, this dimensional requirement is not favourable to reducing the size of the microbox or to the compactness of the hybrid circuit. The advantage of this improvement of the invention is to transfer the welding regions of connectors 6 to a plane other than that of the inner foil 12 of the capacitor, this function being fulfilled by the second frame 15. Like the first frame 14, it is made from a material with a low dielectric constant $\Sigma_2$ and it partly covers the dielectric 11 in such a way that the welding regions are at a minimum distance from the edge of foil 12, but without being deposited on a material with a high dielectric constant $\Sigma_1$.

It is obvious that the case where members 14, 15 are in one piece falls within the scope of the invention. However, bearing in mind the dimensions of the microbox, it is not easy to machine a single monolithic frame 14+15 having a recess. Therefore, it is industrially advantageous to join two frames 14 and 15, which can easily be cut from a ceramic sheet before baking.

The microbox according to FIG. 4 is completed by a frame 7 to which is welded a not shown cover.

FIG. 5 shows another improvement to the basic invention. An electronic circuit frequently requires a decoupling capacitor on its input terminal and a decoupling capacitor on its output terminal, i.e. two capacitors.

Provided that the values of these capacitors are not too high, they are made by metallizing the bottom of box 11 having a high dielectric constant $\Sigma_1$ in order to form a set of four foils, namely foils 16 and 17 constituting a first capacitor and foils 18 and 19 constituting a second capacitor. Various improvements are possible to this basic idea of two integrated capacitors on the same box base.

The foil sets 16+17 and 18+19 are shown side by side in FIG. 5. They can be concentric and according to the invention one capacitor, 16+17 for example, can be centered on the box base, whilst the other capacitor, i.e. 18 and 19 passes round the first in the form of a ring. In such a case, the integrated circuit chip is welded to foil 17 and a suitable connecting wire connects foil 19 to one of the connections 6 of the box or to one of the connecting regions of the integrated circuit.

According to another frequently encountered case, each of the two capacitors has a foil connected to the circuit earth. Thus, the case in which two of the foils are electrically connected forms part of the inventive scope. For example, if the substrate of the integrated circuit is earthed and if foils 17 and 19 are also earthed, it is an industrial simplification to produce foils 17 and 19 by a single metallization region to which is welded the integrated circuit chip. The values of the capacitances are in this case fixed by the areas of foils 16 and 18.

The scope of the invention also covers the case where foils 16 and 18 are formed by a single metallization region, when foil 19 is preferably concentric to foil 17.

In the simplified view of FIG. 5, the box base is made from a single material with a high dielectric constant $\Sigma_1$. By combining the improvement of FIG. 4 with that of FIG. 5, a microbox is obtained which comprises an input capacitor and an output capacitor made on a box substrate with a high dielectric constant and a frame supporting the connections made from a material with a low dielectric constant.

The invention as hitherto described is applicable to capacitors constituted by two foils only and one dielectric. The value of the possible capacitances is limited on the one hand by the available dielectrics and on the other by the area of the foils which cannot be increased if the advantage of the microbox is not to be lost.

FIG. 6 shows an improvement which provides a solution towards relatively higher capacitance values. Compared with the basic invention, in which the microbox base is constituted by a capacitor with a single dielectric layer, the microbox of FIG. 6 is constituted by a multilayer capacitor.

Multilayer capacitors are formed by the stacking of ceramic sheets metallized on one face. Each metallization is centered relative to the supporting sheet, except on one side where the metallization reaches the edge of the sheet permitting the electrical contact with the metal coatings. Moreover, the connections are alternately on one edge of a first sheet and then on the opposite edge of another sheet in such a way that one set of foils (the metal coatings) is joined by a metal coating 20 to one face of the capacitor and the other set of foils is joined by another metal coating 21 to the opposite face of the capacitor.

The use of a multilayer capacitor as the box substrate also requires that, one set of foils is joined to a contacting connection 22 with the substrate of the integrated circuit, whilst the other set of foils is joined by a contacting metal coating 23 to the substrate of the hybrid circuits.

The invention achieves considerable flexibility through the possibility of choosing from among several dielectrics and of stacking the necessary number of foils to obtain the desired capacitance.

Moreover, the technology of manufacturing multilayer capacitors makes it possible to produce a box substrate having two juxtaposed multilayer capacitors in a continuous manner.

A microbox according to FIG. 6 is completed by a single frame 14 or double frame 14+15, connectors 6 according to FIG. 4, an insulating frame 7 and a cover.

The invention has been described with reference to the most general case in which an integrated circuit chip is encapsulated in the microbox. However, the invention also relates to the more general case of monolithic microcircuits which are difficult to handle and this forms the main reason why they are encapsulated.

What is claimed is:

1. A chip carrier for an electronic circuit comprising a partially metallized substrate to which is fixed a circuit chip, wherein said substrate is made up of a plate which has at least one metallized region on each face in order to form the foils of at least one capacitor, wherein said substrate is formed of a rigid material chosen from among those having a high dielectric constant, and wherein said chip carrier has output connections which are supported by a frame integral with said substrate, with said frame being made from a material having a low dielectric constant.

2. A chip carrier according to claim 1, wherein said each face of said substrate has a plurality of metallization regions in order to form at least two juxtaposed capacitors.

3. A chip carrier according to claim 2, wherein said plurality of metallization regions are concentric to one another with the central region serving to receive said electronic circuit chip.

4. A chip carrier for an electronic circuit comprising a partly metallized rigid substrate made from a material having a high dielectric constant and to which is fixed a circuit chip wherein said substrate is constituted by a multilayer capacitor, wherein one of a first set of foils is joined to said circuit chip and one of a second set of foils is joined to said substrate by a connection means, wherein said chip carrier has output connections which are supported by a frame integral with said substrate with said frame being made from a material having a low dielectric constant.

5. A chip carrier according to claim 4, wherein said substrate is constituted by two multilayer capacitors, which are juxtaposed and integral.

* * * * *